(12) United States Patent
Meng et al.

(10) Patent No.: US 8,184,441 B2
(45) Date of Patent: May 22, 2012

(54) FLASH MEMORY DEVICE WITH TELESCOPIC CONNECTOR PORT AND A CASING OF THE FLASH MEMORY DEVICE

(75) Inventors: Xiao-Xia Meng, SuZhou (CN); Cheng-Chung Kung, Chung Ho (TW)

(73) Assignee: A-Data Technology (Suzhou) Co., Ltd., Suzhou, Jiangsu Province (CN)

( * ) Notice: Subject to any disclaimer, the term of this patent is extended or adjusted under 35 U.S.C. 154(b) by 368 days.

(21) Appl. No.: 12/625,548

(22) Filed: Nov. 24, 2009

(65) Prior Publication Data
US 2010/0311257 A1 Dec. 9, 2010

(30) Foreign Application Priority Data
Jun. 4, 2009 (CN) .......................... 2009 1 0033796

(51) Int. Cl.
*H05K 7/10* (2006.01)
(52) U.S. Cl. ........ 361/730; 361/737; 361/752; 439/131; 439/135; 439/136
(58) Field of Classification Search .................. 361/730, 361/737, 752; 439/131, 135, 136
See application file for complete search history.

(56) References Cited

U.S. PATENT DOCUMENTS

| | | | | |
|---|---|---|---|---|
| 7,004,780 | B1* | 2/2006 | Wang | 439/353 |
| 7,307,849 | B2* | 12/2007 | Ho et al. | 361/737 |
| 7,558,070 | B2* | 7/2009 | Kang | 361/752 |
| 7,704,084 | B1* | 4/2010 | Cheng | 439/131 |
| 7,771,215 | B1* | 8/2010 | Ni et al. | 439/131 |
| 7,841,873 | B2* | 11/2010 | Zhu et al. | 439/131 |
| 7,894,198 | B2* | 2/2011 | Zhu et al. | 361/755 |
| 7,896,664 | B1* | 3/2011 | Chou et al. | 439/131 |
| 8,029,303 | B2* | 10/2011 | Chiang | 439/172 |
| 2006/0131431 | A1* | 6/2006 | Finn | 235/492 |
| 2009/0091900 | A1 | 4/2009 | Kang | |
| 2009/0124104 | A1 | 5/2009 | Zhu et al. | |
| 2009/0275224 | A1* | 11/2009 | Ni et al. | 439/131 |

\* cited by examiner

*Primary Examiner* — Dameon Levi
(74) *Attorney, Agent, or Firm* — Cheng-Ju Chiang

(57) ABSTRACT

A flash memory device includes a cover, an electrical module, a slider and a rotatable member for driving the slider. The cover defines a receiving chamber and an opening communicating with the receiving chamber. The electrical module is slideably received in the receiving chamber and includes a circuit board and a connector port electrically connected with the circuit board. The rotatable member has a fixed axis around which the rotatable member revolves. The rotatable member includes a protrusion slideably received in a slot defined in the slider. The connector port is driven to telescopically extend through the opening by the slider which is further driven by the protrusion.

20 Claims, 3 Drawing Sheets

FLASH MEMORY DEVICE WITH TELESCOPIC CONNECTOR PORT AND A CASING OF THE FLASH MEMORY DEVICE

BACKGROUND OF THE INVENTION

1. Field of the Invention

The present invention relates to a personal computer peripheral device, and more particularly to a flash memory device with a telescopic connector port and a casing of the flash memory device for protecting the connector port.

2. Description of Related Art

With the fast development of the electrical domain, flash memory is currently used in variety of apparatus including digital cellular phones, digital cameras, PC cards, and digital setup boxes or inner controllers for notebook computers. A flash memory device such as a U-disk is widely used as an intermedium for accessing data files from one device to another, or like a portable hard drive for installing data.

Usually, a flash memory device includes a circuit board with a plurality of electronic components, such as driver chip, memory chip, oscillator, resistor, etc. for saving and loading data, functioning as a miniature hard drive or wireless communication/transmission, a connector port connected to one end of the circuit board, and a cover enclosing the circuit board. The connector port extends out of the cover for connecting with various peripherals. The connector port is usually housed and protected from dust by a detachable cap.

However, when such flash memory device is connected with a host device, such as a computer, its detached cap may be left unnoticed near the computer and lost due to its small size. Once the extra cap is lost, the connector port cannot be easily shielded from dust and might be damaged by outside forces.

Hence, an improved flash memory device and a casing thereof are needed to solve the problem above.

BRIEF SUMMARY OF THE INVENTION

The present invention provides a flash memory device including a cover, an electrical module received in the cover, a slider and a rotatable member for driving the slider so that the electrical module can be moveable respect to the cover. The cover defines a receiving chamber extending along a longitudinal direction and an opening communicating with the receiving chamber. The electrical module is slideably received in the receiving chamber and includes a circuit board and a connector port electrically connected with the circuit board. The slider is slideably mounted in the receiving chamber and defines a slot extending along a transverse direction perpendicular to the longitudinal direction. The rotatable member has a fixed axis around which the rotatable member revolves. The rotatable member includes a protrusion slideably received in the slot. The connector port is driven to telescopically extend through the opening by the slider which is further driven by the protrusion.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE PREFERRED EMBODIMENT

In the following description, numerous specific details are set forth to provide a thorough understanding of the present invention. However, it will be obvious to those skilled in the art that the present invention may be practiced without such specific details. In other instances, well-known circuits have been shown in block diagram form in order not to obscure the present invention in unnecessary detail. For the most part, details concerning timing considerations and the like have been omitted inasmuch as such details are not necessary to obtain a complete understanding of the present invention and are within the skills of persons of ordinary skill in the relevant art.

Figure 1:
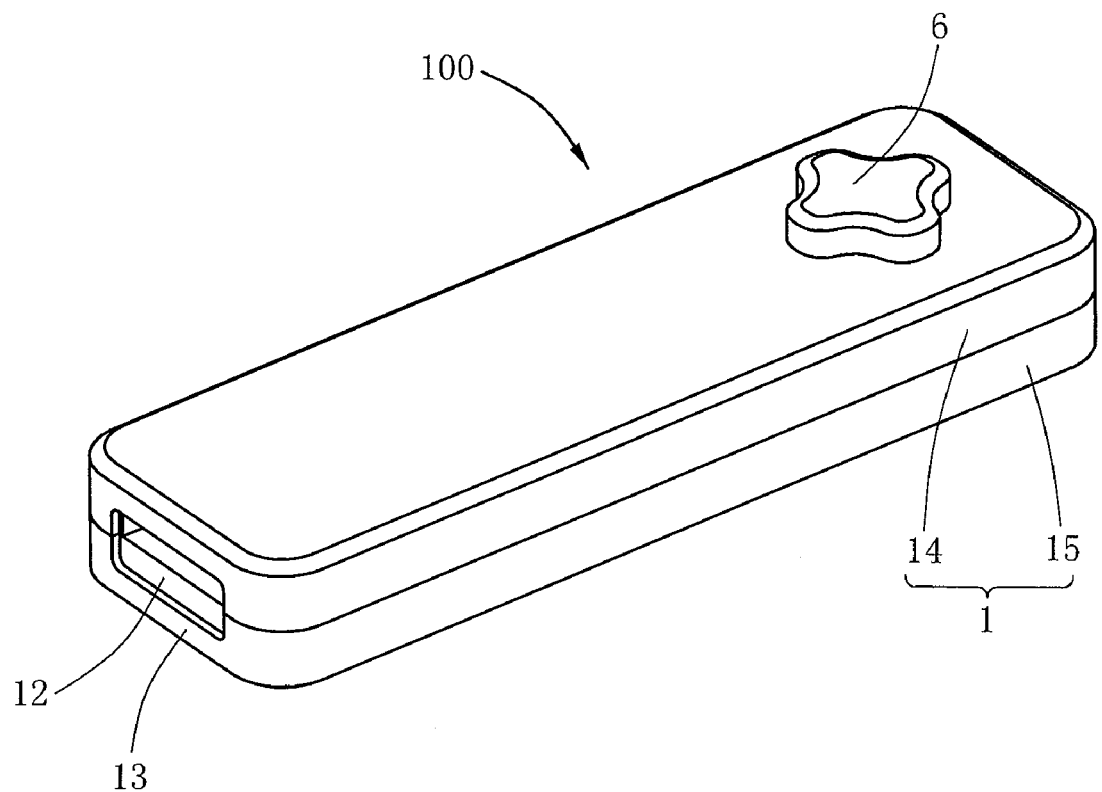
FIG. 1 is a perspective view of a flash memory device according to a preferred embodiment of the present invention showing a connector port hidden in a cover.
Figure 2:
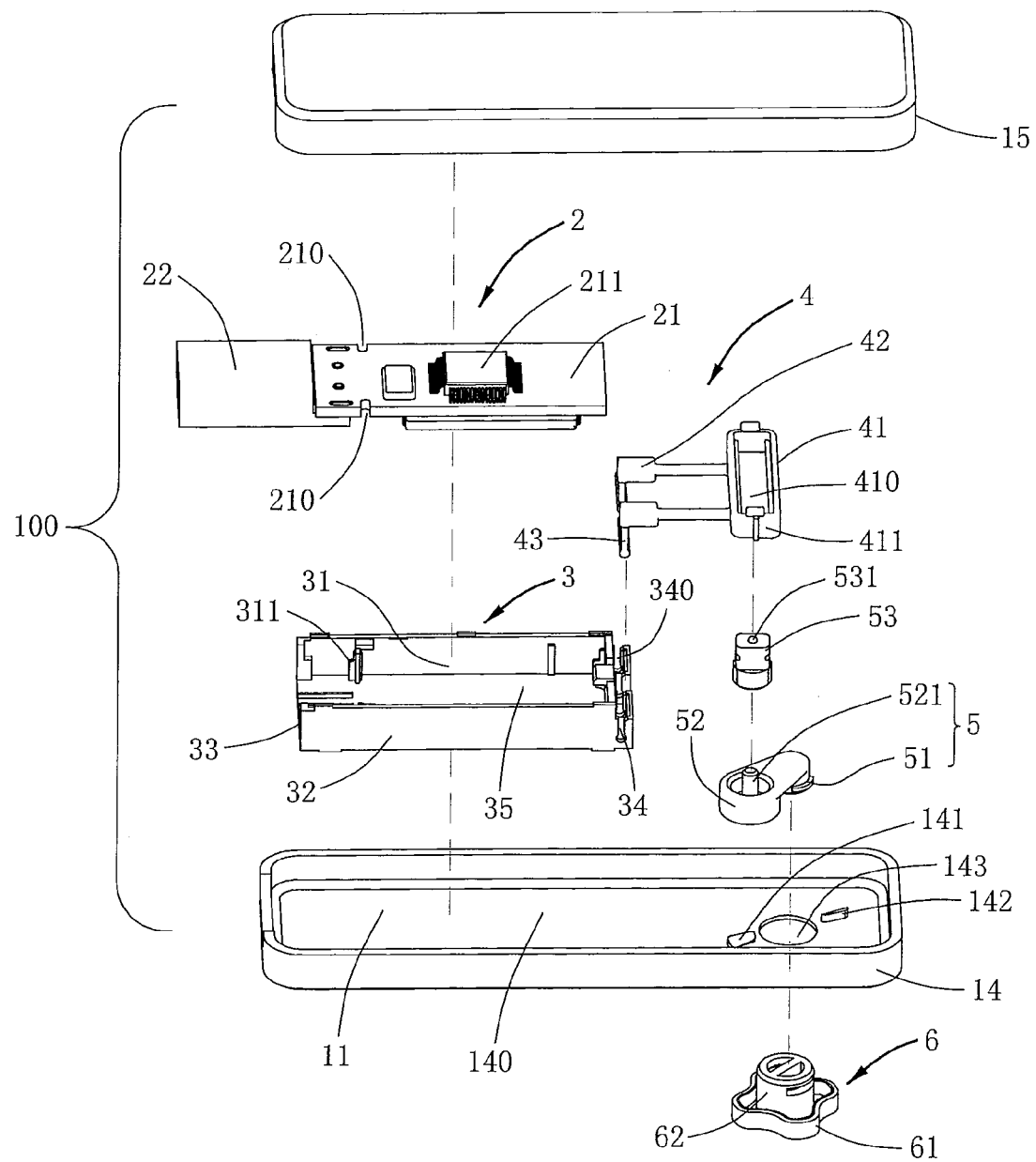
FIG. 2 is an exploded view of the flash memory device shown in FIG. 1.

Referring to FIGS. 1 and 2, a flash memory device 100 which can be used for data transmission with a host device according to a preferred embodiment of the present invention is disclosed. The flash memory device 100 includes a cover 1, an electrical module 2, a frame 3 for mounting the electrical module 2, a slider 4, a rotatable member 5 for driving the slider 4 and a spin button 6 assembled to the cover 1.

The cover 1 is substantial rectangular shaped and defines a receiving chamber 11 extending along a longitudinal direction A-A and an opening 12 formed at a front end 13 of the cover 1 and communicating with the receiving chamber 11. The cover 1 includes a top part 14 and a bottom part 15 attached to the top part 14 with the receiving chamber 11 sandwiched between the top and the bottom parts 14, 15. The top part 14 includes a pair of first and second ribs 141, 142 formed on an inner side 140 thereof, and a through hole 143 defined through the top part 14. The first and the second ribs 141, 142 are aligned with each other for positioning the rotatable member 5, which will be detailed hereinafter. The through hole 143 is located between the pair of first and the second ribs 141, 142 and communicates with the receiving chamber 11.

The electrical module 2 includes a circuit board 21 and a connector port 22 mechanically and electrically connected with the circuit board 21. The circuit board 21 includes a pair of recesses 210 formed on lateral sides thereof. A plurality of chips 211 are mounted on the circuit board 21 for processing signals. According to the preferred embodiment of the present invention, the connector port 22 is a standard USB plug but not limited. That is to say the connector port 22 can be PCI interface, SATA interface etc.

Figure 3:
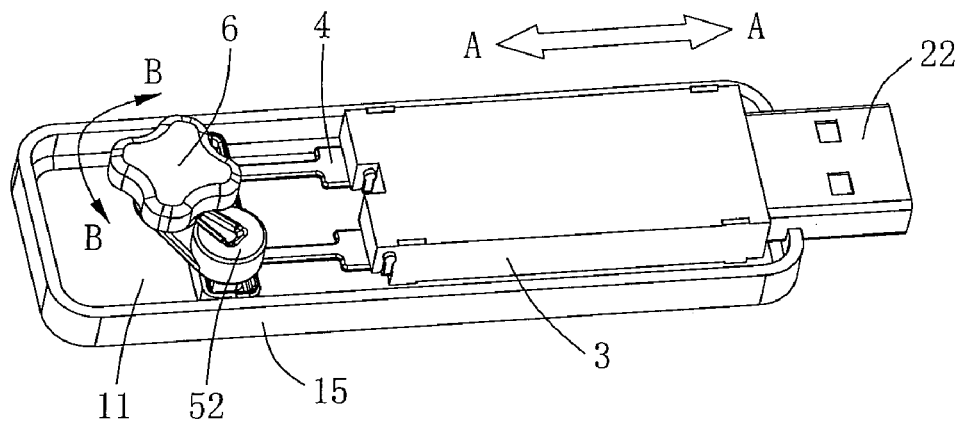
FIG. 3 is a part perspective view of the flash memory device with a top part removed therefrom in order to illustrate a status when the connector port extends beyond the cover.
Figure 4A:
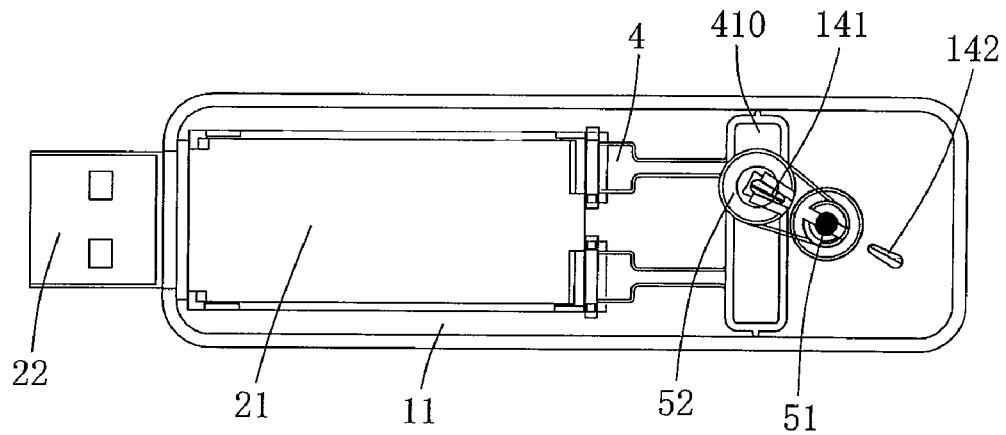
FIG. 4A is a top view of the flash memory device with a bottom part and a spin button both removed therefrom under a condition that the connector port extends beyond the cover.

The frame 3 is rectangular shaped and includes a pair of side walls 31, 32, a front side 33 and a rear side 34 opposite to the front side 33. A cavity 35 is formed between the pair of side walls 31, 32 for accommodating the circuit board 21. Each side wall 31, 32 includes a projection 311 extending into the cavity 35 to be received in the recesses 210 so that the circuit board 21 can be firmly fixed in the frame 3. As a result, the electrical module 2 can be slideable in the receiving chamber 11. As shown in FIGS. 3 and 4A, after the circuit board 21 is assembled to the frame 3, the connector port 22 extends beyond the frame 3 through the front side 33.

Referring to FIGS. 2-4A, the slider 4 include a base 41, a pair of fastening portions 42 perpendicular to the base 41 and a pair of connecting portions 43 connecting the fastening portions 42 and the base 41. The base 41 is rectangular shaped and includes a rectangular slot 410 extending along a transverse direction perpendicular to the longitudinal direction A-A as shown in FIG. 3. The slot 410 is enclosed by four peripheral walls 411. The fastening portions 42 are fixed in a slit 340 defined in the rear side 34 of the frame 3 so that the slider 4 and the frame 3 can be moveable together in the receiving chamber 11. According to the preferred embodiment of the present invention, the electrical module 2 is directly driven by the frame 3 which is further directly driven by the slider 4. That is to say, the electrical module 2 is indirectly driven by the slider 4. However, in other embodiments, the frame can be omitted and under this condition the slider 4 can be directly fixed to the circuit board 21.

The rotatable member 5 is received in the receiving chamber 11 as well and defines a fixed axis 51, an offset portion 52 offset from the fixed axis 51 and a protrusion 53 fixed to the offset portion 52. The rotatable member 5 is a crank so that the protrusion 53 can 360-degree revolve around the fixed axis 51. The offset portion 52 includes a post 521 and the protrusion 53 defines a hole 531 to receive the post 521 so that the protrusion 53 can be fixed to the offset portion 52 and can be rotatable together with the offset portion 52. According to the preferred embodiment of the present invention, the protrusion 53 and the offset portion 52 are two independent elements and can be fixed together. However, it is obvious to those of ordinary skill in the art that the protrusion 53 can be integrally molded with the offset portion 52. When the rotatable member 5 revolves around the fixed axis 51, the protrusion 53 is slideable in the slot 410 of the slider 4 through its out surfaces abutting against the peripheral walls 411. Because the fixed axis 51 can't move along the longitudinal direction A-A, the slider 4 is then driven to move along the longitudinal direction A-A. Since the slider 4, the frame 3 and the electrical module 2 are fixed together, the connector port 22 can be slideable along the longitudinal direction A-A to alternatively extend beyond the opening 12 as best shown in FIGS. 3 and 4A.

Figure 4B:
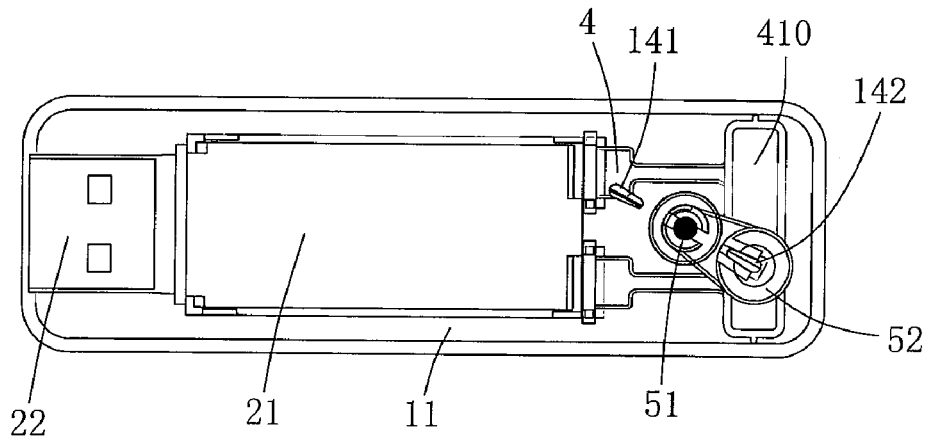
FIG. 4B is another top view of the flash memory device similar to FIG. 4A while showing the connector port gets back inside the cover.

The spin button 6 is assembled to the top part 14 and includes a handle portion 61 extending beyond the top part 14 and a contracted post 62 extending from the handle portion 61. The post 62 is fixed to the rotatable member 5 through the through hole 143 so that they can be rotatable together. The fixed axis 51 extends through the spin button 6 along a direction perpendicular to the longitudinal direction A-A and the transverse direction. The handle portion 61 is driven by the end user to be rotatable in a horizontal plane and along the direction B-B. As shown in FIG. 4A, the first rib 141 stops the rotatable member 5 at a first position where the connector port 22 extends beyond the opening 12. The second rib 142 stops the rotatable member 5 at a second position where the connector port is hidden in the opening as shown in FIG. 4B.

It is to be understood, however, that even though numerous, characteristics and advantages of the present invention have been set forth in the foregoing description, together with details of the structure and function of the invention, the disclosed is illustrative only, and changes may be made in detail, especially in matters of number, shape, size, and arrangement of parts within the principles of the invention to the full extent indicated by the broad general meaning of the terms in which the appended claims are expressed.

We claim:

1. A flash memory device comprising:
   a cover defining a receiving chamber extending along a longitudinal direction and an opening communicating with the receiving chamber;
   an electrical module slideably received in the receiving chamber and comprising a circuit board and a connector port electrically connected with the circuit board;
   a slider slideably mounted in the receiving chamber and defining a slot extending along a transverse direction perpendicular to the longitudinal direction; and
   a rotatable member having a fixed axis around which the rotatable member revolves, the rotatable member comprising a protrusion slideably received in the slot; wherein
   the connector port is driven to telescopically extend through the opening by the slider which is further driven by the protrusion.

2. The flash memory device according to claim 1, wherein the slot is enclosed by four peripheral walls and the protrusion has a flat out surface abutting against the corresponding peripheral wall.

3. The flash memory device according to claim 1, wherein the rotatable member is a crank which 360-degree revolves around the fixed axis in the receiving chamber.

4. The flash memory device according to claim 1, wherein the protrusion is detachably mounted to the rotatable member and is offset from the fixed axis so that the protrusion can revolve around the fixed axis.

5. The flash memory device according to claim 1, wherein the cover comprises a top part and a bottom part attached to the top part with the receiving chamber formed between the top and the bottom parts, the top part comprising first and second ribs formed on an inner side thereof under a condition that the first and the second ribs are aligned with each other, the first rib stopping the rotatable member at a first position where the connector port extends beyond the opening and the second rib stopping the rotatable member at a second position where the connector port is hidden in the opening.

6. The flash memory device according to claim 5, wherein the top part defines a through hole between the first and the second ribs, the flash memory device further comprising a spin button mounted to the top part, the spin button having a handle portion and a post extending through the through hole to be fixed to the rotatable member so that the spin button and the rotatable member can be rotatable simultaneously.

7. The flash memory device according to claim 6, wherein the handle portion is attached to the top part and is wholly exposed to the exterior, the handle portion being driven to be rotatable in a horizontal plane.

8. The flash memory device according to claim 1, wherein the connector port is indirectly driven to telescopically extend through the opening by the slider, the flash memory device further comprising a frame slideably mounted in the receiving chamber, the frame defining a cavity to receive the circuit board while leaving the connector port protrude from the frame, the slider being fastened to the frame so that the slider can be moveable together with the frame and the electrical module.

9. The flash memory device according to claim 8, wherein the slider comprises a base with the slot defined therein, a fastening portion perpendicular to the base and a connecting portion connecting the base and the fastening portion, the frame defining a slot at the rear of the cavity to receive the fastening portion.

10. A flash memory device comprising:
a cover defining a receiving chamber and an opening communicating with the receiving chamber;
a frame slideably received in the receiving chamber and defining a cavity;
an electrical module fixed in the cavity and comprising a circuit board and a connector port electrically and mechanically connected with the circuit board, the connector port extending beyond an end of the frame;
a slider fixed to the frame to be slideable with the frame simultaneously;
a rotatable member biasing against the slider and having a fixed axis around which the rotatable member revolves; and
a spin button fixed with rotatable member and comprising a handle portion exposed to the exterior from a top or a bottom side of the cover;
wherein the connector port is driven to telescopically extend through the opening by the slider which is further driven by the rotatable member.

11. The flash memory device according to claim 10, wherein the rotatable member is received in the receiving chamber, the rotatable member being a crank which 360-degree revolves around the fixed axis.

12. The flash memory device according to claim 10, wherein the frame defines a slot and the rotatable member has a protrusion slideably received in the slot under a condition that the protrusion is offset from the fixed axis so that the protrusion can revolve around the fixed axis.

13. The flash memory device according to claim 12, wherein the slider is slideable along a first direction and the slot extends along a second direction perpendicular to the first direction.

14. The flash memory device according to claim 10, wherein the cover comprises first and second ribs formed on an inner side thereof under a condition that the first and the second ribs are aligned with each other, the first rib stopping the rotatable member at a first position where the connector port extends beyond the opening and the second rib stopping the rotatable member at a second position where the connector port is hidden in the opening.

15. The flash memory device according to claim 14, wherein the cover defines a through hole between the first and the second ribs, the spin button comprising a post extending from the handle portion to be fixed to the rotatable member through the through hole so that the spin button and the rotatable member can be pivotable simultaneously.

16. The flash memory device according to claim 15, wherein the handle portion is driven to be rotatable in a horizontal plane.

17. A casing of a flash memory device comprising:
a cover defining a receiving chamber extending along a longitudinal direction and a rectangular opening communicating with the receiving chamber for a connector port alternatively extending through the opening;
a frame slideably received in the receiving chamber along the longitudinal direction;
a slider fixed to the frame to be slideable with the frame simultaneously, the slider defines a slot extending along a transverse direction perpendicular to the longitudinal direction;
a rotatable member driving the slider and having a fixed axis around which the rotatable member revolves, the rotatable member having a protrusion slideably received in the slot under a condition that the protrusion is offset from the fixed axis; and
a spin button mounted to the cover to be fixed with the rotatable member, the spin button being driven to be rotatable in a horizontal plane;
wherein frame is driven to slide along the longitudinal direction by the slider which is further driven by the rotatable member and the spin button, corporately.

18. The casing of a flash memory device according to claim 17, wherein the rotatable member is received in the receiving chamber, the rotatable member being a crank which 360-degree revolves around the fixed axis.

19. The casing of a flash memory device according to claim 17, wherein the cover comprises a top part and a bottom part attached to the top part with the receiving chamber formed therebetween, the top part comprising first and second ribs formed on an inner side thereof under a condition that the first and the second ribs are aligned with each other, the first and the second ribs stopping the rotatable member at different first and second positions, respectively.

20. The casing of a flash memory device according to claim 19, wherein the top part defines a through hole between the first and the second ribs and the spin button has a post extending through the through hole to be fixed to the rotatable member so that the spin button and the rotatable member can be rotatable simultaneously.

* * * * *